United States Patent [19]
Ashby et al.

[11] Patent Number: 5,092,957
[45] Date of Patent: Mar. 3, 1992

[54] CARRIER-LIFETIME-CONTROLLED SELECTIVE ETCHING PROCESS FOR SEMICONDUCTORS USING PHOTOCHEMICAL ETCHING

[75] Inventors: Carol I. H. Ashby, Edgewood; David R. Myers, Albuquerque, both of N. Mex.

[73] Assignee: The United States of America as represented by the United States Department of Energy, Washington, D.C.

[21] Appl. No.: 441,025

[22] Filed: Nov. 24, 1989

[51] Int. Cl.$^5$ ............................................. H01L 21/00
[52] U.S. Cl. .................................. 156/628; 156/643; 156/646; 156/654; 437/234
[58] Field of Search ............... 156/628, 643, 655, 662, 156/646, 654, 657; 437/234, 233, 225

[56] References Cited

U.S. PATENT DOCUMENTS

| | | | |
|---|---|---|---|
| 4,514,251 | 4/1985 | Van Ommen et al. | 156/628 |
| 4,523,976 | 6/1985 | Bukhman | 156/643 |
| 4,584,055 | 4/1986 | Kayamuma et al. | 156/628 |
| 4,595,454 | 6/1986 | Dautremont-Smith et al. | 156/647 |
| 4,599,136 | 7/1986 | Araps et al. | 156/643 |
| 4,601,778 | 7/1986 | Robb | 156/628 |
| 4,648,936 | 3/1987 | Ashby et al. | 156/643 |
| 4,648,938 | 3/1987 | Ashby et al. | 156/643 |
| 4,652,334 | 3/1987 | Jain et al. | 156/628 |
| 4,718,972 | 1/1988 | Babu et al. | 156/628 |
| 4,732,646 | 3/1988 | Elsner et al. | 156/628 |
| 4,750,971 | 6/1988 | Maas et al. | 156/628 |
| 4,880,493 | 11/1989 | Ashby et al. | 56/628 |

OTHER PUBLICATIONS

C. I. H. Ashby, "Photochemical Dry Etching of GaAs", *Applied Physics Letters*, vol. 45, No. 8, Oct. 15, 1984, pp. 892-894.

C. I. H. Ashby et al. "Composition-Selective Photochemical Etching of Compound Semiconductors", *Applied Physics Letters*, vol. 47, No. 1, Jul. 1, 1985, pp. 62-63.

R. A. Smith, *Semiconductors*, 2nd Ed., Cambridge University Press New York, 1978, pp. 279-281.

C. I. H. Ashby et al., "Effect of the Band-Gap Characteristics on Laser-Induced Dry Etching of Semiconductors", *Proc. 172nd Meeting of the Electrochemical Society*, Honolulu, Oct. 18-23, 1987.

*Primary Examiner*—David A. Simmons
*Assistant Examiner*—Thi Dang
*Attorney, Agent, or Firm*—Armand McMillan; James H. Chafin; William R. Moser

[57] ABSTRACT

The minority carrier lifetime is significantly much shorter in semiconductor materials with very high impurity concentrations than it is in semiconductor materials with lower impurity concentration levels. This phenomenon of reduced minority carrier lifetime in semiconductor materials having high impurity concentration is utilized to advantage for permitting highly selective semiconductor material etching to be achieved using a carrier-driven photochemical etching reaction. Various means may be employed for increasing the local impurity concentration level in specific near-surface regions of a semiconductor prior to subjecting the semiconductor material to a carrier-driven photochemical etching reaction. The regions having the localized increased impurity concentration form a self-aligned mask inhibiting photochemical etching at such localized regions while the adjacent regions not having increased impurity concentrations are selectively photochemically etched. Liquid- or gas-phase etching may be performed.

6 Claims, No Drawings

CARRIER-LIFETIME-CONTROLLED SELECTIVE ETCHING PROCESS FOR SEMICONDUCTORS USING PHOTOCHEMICAL ETCHING

The U.S. Government has rights in this invention pursuant to Contract No. DE-AC04-76DP00789 awarded by the U.S. Department of Energy to AT&T Technologies, Inc.

BACKGROUND AND SUMMARY OF THE INVENTION

The present invention relates generally to a process for selective photochemical etching of semiconductor materials in the manufacture of semiconductor devices. More particularly, the present invention is directed to a highly selective etching process for semiconductor materials in which regions of the semiconductor material surface with low minority-carrier lifetimes resulting from appropriate local impurity densities act as a self-aligned mask for etching using a carrier-driven photochemical etching reaction.

A most unique aspect of the present invention is the highly selective suppression of the etching of a region of a semiconductor surface by the deliberate localized introduction of relatively high concentration levels of impurity atoms. These impurity atoms, which may or may not be atoms of common dopant species, promote carrier recombination within the semi-conductor, thereby drastically reducing minority carrier lifetimes. These spatially localized regions of enhanced carrier recombination serve as a self-aligned mask during carrier-driven photochemical etching of the semiconductor material. Advantageously, various means for increasing the local impurity level may be employed.

In the fabrication of semiconductor devices, it is highly desirable to be able to produce self-aligned masks in the semiconductor material surface region itself in order to reduce the necessity for achieving exact registration and alignment of different masks for different steps in the total device fabrication process, which is a serious problem, and since, with the provision of self-aligning masks, fewer masking steps are required during device fabrication. However, known self-aligning technologies for semiconductor processing are generally applicable to only one semiconductor material and may furthermore require the employment of complex metallurgical techniques. Thus, there has remained a need for a process which is widely applicable to the entire range of elemental and compound semiconductors and, furthermore, for such a process which can be used with any carrier-driven photochemical reactions as may be developed for specific semiconductor materials. The present invention has as one of its objects the provision of such a process having wide applicability.

An ion-bombardment-damage controlled selective etching process has been previously proposed, however, such a process is of limited applicability, especially when the upper-most layer of a device structure must be very heavily doped, e.g. for semiconductor laser or SISFET structure fabrication. The present invention has as another of its objects the provision of a process by which the limitations inherent in the prior ion-bombardment-damage controlled etching process are advantageously overcome.

An important aspect of the present process which differs from the previous ion-bombardment-damage controlled etching process is that, in the present process, thermal treatment of the semiconductor material is required after ion implantation of impurities before any etching is performed.

Prior techniques for selective dry photochemical etching of semiconductor materials are known for example from U.S. Pat. Nos. 4,648,936 and 4,648,948 the disclosures of which patents are hereby incorporated herein by reference thereto.

Other relevant prior descriptions of photochemical etching processes for semiconductor materials are disclosed for example in Ashby, "Photochemical Dry Etching of GaAs", *Appl. Phys. Lett.* Vol. 45, p. 892 (1984); Ashby et al., "Composition-selective Photochemical Etching of Compound Semiconductors", *Appl. Phys. Lett.* Vol. 47, p. 62 (1985); Ashby et al., "Effect of the Band-gap Characteristics on Laser-induced Dry Etching of Semiconductors", *Proc. 172nd Mtg. of the Electrochemical Society* (Honolulu, October 18–23, 1987); and in Smith, R.A., *Semiconductors*, 2nd Ed., Cambridge Univ. Press, New York, 1978, p. 279, the disclosures of all of which are hereby incorporated herein by reference thereto.

Other conventional processes and techniques for masking and/or selectively etching semiconductor materials are known for example from U.S. Pat. Nos. 4,523,976; 4,595,454 and 4,599,136.

The process of the present invention for selective photochemical etching of semiconductor materials has the potential advantage of reducing the number of separate masking and mask-removal process steps inherent in conventional device fabrication techniques, thereby allowing for self-aligned structures with the associated advantages of eliminating mask registration errors, allowing for more densely packed semiconductor devices and higher performance semiconductor devices and circuits, and improving manufacturing yields. Further features, aspects and advantages of the process of the present invention will be made more apparent from the following detailed description.

DETAILED DESCRIPTION OF THE INVENTION

In general, it is known that a photochemical reaction etching process, either of the so-called wet type or dry type, that requires direct participation of electronic charge carriers (i.e. electrons and/or holes) that are generated by light absorption in a semiconductor is sensitive to the particular electronic properties of the respective semiconductor material being etched. The etching reaction rate in photochemical etching is determined principally by the supply of minority carriers (i.e. holes for n-type semiconductor materials and electrons for p-type semiconductor materials, respectively) at the semiconductor material surface. Further, the absorption of light (i.e. photonic radiation energy) and associated generation of minority carriers in the semiconductor material occurs over a depth from the semiconductor material surface that is determined by the semiconductor material's absorption coefficient for the exciting light radiation wavelength.

Furthermore, in order for those minority carriers which are generated beneath the semiconductor material's surface to effect photochemical etching at the surface, the carriers created beneath the surface must have long enough lifetimes to permit them to reach the material's surface before being lost through recombination processes within the material. Reduction of minority carrier lifetime reduces the number of carriers that survive long enough to reach the surface.

The minority carrier lifetime is significantly much shorter in semiconductor materials with very high impurity concentrations than it is in semiconductor materials with lower impurity concentration levels. This phenomenon of reduced minority carrier lifetime in semiconductor materials having high impurity concentrations is utilized to advantage in the present invention for permitting highly selective semiconductor material etching to be achieved using a carrier-driven photochemical etching reaction.

When laser-driven etching of a semiconductor material requires direct participation of photo-generated carriers, the etching quantum yield will be sensitive to the electronic properties of the specific semiconductor material. The band-gap energy of the semiconductor determines the minimum photon energy for carrier-driven etching since sub-gap photons do not generate free carriers in the semiconductor material. However, only those free carriers that reach the reacting surface contribute to the carrier-driven etching reaction, and the ultimate carrier flux to the reacting surface is controlled by more subtle electronic properties than the lowest energy band-gap. For example, the initial depth of carrier generation and probability of carrier recombination between the point of generation and the surface profoundly influence the quantum yield. Appropriate manipulation of process parameters can provide additional reaction control based upon such secondary electronic properties.

The photochemical etching process of the present invention permits highly selective removal of specific regions of a semiconductor material's surface while producing little or no material removal in adjacent regions of the semiconductor material which have been previously treated to produce therein very high concentration levels of one or more impurity species in a laterally localized near-surface region of the semiconductor material. These treated regions of the semiconductor material exhibit significantly reduced minority carrier lifetimes resulting from appropriate local impurity densities and act as a self-aligned mask for etching using a carrier-driven photochemical etching reaction employing either liquid-phase (i.e. wet type) or gas-phase (i.e. dry type) reactants because the surface of those regions with the locally introduced impurity concentrations that reduce the minority carrier lifetimes therein is not etched significantly by the carrier-driven photochemical etching reaction, while the adjacent regions without these locally introduced impurity concentrations exhibit longer minority carrier lifetimes and are thus etched much more rapidly.

The carrier-lifetime-controlled selective photochemical etching process according to the present invention should find application with a wide range of semiconductor materials including Si, Ge, Group III-V compounds and Group II-VI compounds, and should also be useful for the fabrication of a wide variety of microelectronic and opto-electronic devices.

The self-aligned masking characteristic of the present process is especially advantageous in that, because according to the present invention the mask is formed directly in the semiconductor material itself by the treatment of the specific regions of the semiconductor material which locally increases the impurity concentration therein, the difficult and serious task of trying to achieve exact registration and alignment of different masks for different steps in the total fabrication of a semiconductor device is facilitated or reduced since fewer masking steps are required in accordance with present process. Furthermore, whereas conventional self-aligning techniques for semiconductor processing are generally applicable to only one semiconductor material and may additionally require complex metallurgy, it is contemplated that the process according to the present invention should be applicable to the entire range of elemental and compound semiconductors and be usable with any carrier-driven photochemical reactions developed for specific semiconductor materials.

While similar in purpose to the previously proposed ion-bombardment-damage controlled etching technique, the process according to the present invention differs critically therefrom in that according to the present process thermal treatment of the semiconductor material is required before any etching is performed thereon. This distinction is critically important for assuring the survival of metastable strained-layer heterostructures in the semiconductor material, which strained-layer heterostructures may not survive implantation and/or thermal cycling above the growth temperatures after surface material removal. Additionally, the process according to the present invention provides flexibility in applying selective photochemical etching for highly complicated, multiple-step fabrication processes such as are routinely employed in fabricating integrated circuits in Si-based technologies. Still further, the process according to the present invention does not suffer the limitation of the prior ion-bombardment-damage controlled etching process which limitation exists when the upper-most layer of a device structure must be very heavily doped, e.g., for semiconductor laser or SISFET structures. Advantageously, according to the present invention, the required heavy doping is locally created by an annealed implant or in-diffusion step used to control the etching.

The present inventors have demonstrated an embodiment of the process according to the present invention with GaAs semiconductor material. According to this embodiment, the doping level of selected regions of a GaAs wafer surface were changed from $1.0 \times 10^{17}/cm^2$ n-type to very heavily doped p-type by the in-diffusion of Zn. The Zn in-diffusion was performed at 650° C. for 15 minutes with a diethylzinc source and an arsine overpressure in hydrogen carrier gas. These diffusion conditions typically produce Zn doping at levels in excess of $10^{20}/cm^3$ in the near-surface region.

It should be understood that the specific technique and conditions used for the Zn in-diffusion are not critical to the practice of the invention; other Zn in-diffusion techniques would be equally effective in terms of selective etching control.

In accordance with the demonstrated embodiment, the undiffused, lower doped (i.e. $10^{17}/cm^2$) wafer material was etched by a gas-phase carrier-driven photochemical reaction to a depth of more than 0.17 $\mu m$ in 15 minutes using 514.5 nm light (0.6 W in a 230 $\mu m$ FWHM Gaussian beam) and Cl-atoms generated in a d.c. glow discharge (3.00 Torr 5% HCl in He; interelectrode current and voltage of 0.5 mA and $-390 \pm 10$ V, respectively). Under these same conditions, no detectable etching (i.e. <0.01 $\mu m$) of the heavily Zn-doped regions of the wafer occurred. This represents an etch selectivity ratio greater than 17:1.

The present inventors have also demonstrated an etch selectivity ratio greater than 23:1 for $1 \times 10^{17}/cm^3$ n-

GaAs versus $7 \times 10^{18}$/cm$^2$ n-GaAs in accordance with the present invention, and thus it has been found that the enhanced etch selectivity produced by the process of the present invention does not require a difference in doping type but only a difference in dopant/impurity concentration between the semiconductor material regions.

It should be stressed that the means employed for increasing the local impurity concentration level is not restricted to the technique described for the above embodiment, but rather various means may be employed in accordance with the present invention for increasing the local impurity concentration level. For example, one way in which the local impurity concentration level might be increased is through a thermal in-diffusion process, such as is frequently employed with Zn to produce heavily doped regions in GaAs material, as in the embodiment described above, or with Au to locally enhance recombination in Si material.

Another way to increase the local impurity concentration of a region of a semiconductor material which may be employed in accordance with the invention is through ion implantation of a dopant or impurity species followed by annealing to both activate the impurity and remove implantation-induced effects. In this regard, it should be noted that the etching process according to the present invention does not employ lattice defects produced by implantation, but rather, in practicing the invention the ions implanted by ion implantation only serve as a source of impurities that are electrically activated by thermal annealing. This annealing step will have removed ion implantation-induced defects prior to the etching steps described above.

Still another means for increasing local impurity/dopant concentrations is through local selective growth of heavily doped regions.

It should further be understood that while the process according to the present invention readily lends itself to the use of commonly employed dopants and impurities for reducing carrier lifetimes in order to obtain selective etching, the impurities and/or dopants used to reduce carrier lifetimes in practicing the process of the present invention may or may not be commonly used dopant species.

From the foregoing description, one skilled in the art can easily ascertain the essential characteristics of the process according to the present invention, and, without departing from the spirit and scope thereof, can make various changes and modifications of the invention to adapt it to various usages, materials and conditions.

What is claimed:

1. A process for selectively photochemically etching a semiconductor material, comprising:

introducing at least one impurity into at least one selected region of a semiconductor material to be etched to increase a local impurity concentration in said at least one selected region relative to an impurity concentration in regions of said semiconductor material adjacent thereto, for reducing minority carrier lifetimes within said at least one selected region relative to said adjacent regions for thereby providing a photochemical etch-inhibiting mask at said at least one selected region; and etching said semiconductor material by subjecting the surface of said semiconductor material to a carrier-driven photochemical etching reaction for selectively etching said regions of said semiconductor material adjacent said at least one selected region having said increased impurity concentration;

wherein said step of introducing at least one impurity is performed so as not to produce damage to said at least one selected region before any etching is performed.

2. The process according to claim 1, wherein said carrier-driven photochemical etching reaction employs a liquid-phase etchant.

3. The process according to claim 1, wherein said carrier-driven photochemical etching reaction employs a gas-phase etchant.

4. The process according to claim 1, wherein the step of introducing said at least one impurity into said at least one selected region of said semiconductor material is performed by a thermal in-diffusion process.

5. The process according to claim 1, wherein the step of introducing said at least one impurity into said at least one selected region of said semiconductor material is performed by ion implantation of an impurity species followed by annealing to activate the impurity and remove implantation-induced effects.

6. The process according to claim 1, wherein the step of introducing said at least one impurity into said at least one selected region of said semiconductor material is performed by local selective growth of a heavily doped region at each said selected region of said semiconductor.

* * * * *